(12) United States Patent
Stamper et al.

(10) Patent No.: US 9,818,637 B2
(45) Date of Patent: Nov. 14, 2017

(54) DEVICE LAYER TRANSFER WITH A PRESERVED HANDLE WAFER SECTION

(71) Applicant: GLOBALFOUNDRIES Inc., Grand Cayman (KY)

(72) Inventors: Anthony K. Stamper, Essex Junction, VT (US); Mukta G. Farooq, Hopewell Junction, NY (US); John A. Fitzsimmons, Hopewell Junction, NY (US); Mark D. Jaffe, Essex Junction, VT (US); Randy L. Wolf, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/982,576

(22) Filed: Dec. 29, 2015

(65) Prior Publication Data

US 2017/0186643 A1  Jun. 29, 2017

(51) Int. Cl.
*H01L 21/762* (2006.01)
*H01L 27/13* (2006.01)

(52) U.S. Cl.
CPC ........ *H01L 21/76256* (2013.01); *H01L 27/13* (2013.01); *H01L 2221/68318* (2013.01)

(58) Field of Classification Search
CPC ........... H01L 21/2007; H01L 21/76256; H01L 21/76898; H01L 27/13; H01L 2224/80001; H01L 2221/68322; H01L 2221/68363; H01L 2221/68368; H01L 2221/68377; H01L 2221/301; H01L 29/0649; H01L 29/78; H01L 21/302; H01L 21/6835; H01L 21/7624; H01L 21/7685
See application file for complete search history.

(56) References Cited

U.S. PATENT DOCUMENTS 5,414,276 A    5/1995  McCarthy
6,582,985 B2   6/2003  Cabuz et al.
(Continued)

FOREIGN PATENT DOCUMENTS

EP    1555517 A2    7/2005

OTHER PUBLICATIONS

German Patent and Trade Mark Office, Official Action issued in Application No. 10 2016 226 280.7 dated Aug. 9, 2017 and English translation thereof.

*Primary Examiner* — Cheung Lee
*Assistant Examiner* — Stephen C Smith
(74) *Attorney, Agent, or Firm* — Anthony Canale; Thompson Hine LLP

(57) ABSTRACT

Assemblies including a device layer of a silicon-on-insulator (SOI) substrate and a replacement substrate replacing a handle wafer of the SOI substrate, and methods for transferring the device layer of the SOI substrate from the handle wafer to the replacement substrate. A device structure is formed in a first section of the handle wafer, and a second section of the handle wafer adjoining the first section of the handle wafer is removed to expose a surface of the buried dielectric layer of the silicon-on-insulator substrate. A permanent substrate is attached to the surface of the buried dielectric layer. When the permanent substrate is attached to the surface of the buried dielectric layer, the section of the handle wafer is received inside a cavity defined in the permanent substrate.

12 Claims, 2 Drawing Sheets

(56) References Cited

U.S. PATENT DOCUMENTS

| | | | |
|---|---|---|---|
| 7,605,053 | B2 | 10/2009 | Couillard et al. |
| 7,964,807 | B2 | 6/2011 | Kurtz et al. |
| 8,580,654 | B2 | 11/2013 | Kerdiles et al. |
| 9,064,697 | B2 | 6/2015 | Arriagada et al. |
| 2007/0045820 | A1* | 3/2007 | Rybnicek .......... H01L 21/76898 257/704 |
| 2011/0233785 | A1 | 9/2011 | Koester et al. |
| 2011/0241185 | A1* | 10/2011 | Koester ................. H01L 21/568 257/659 |
| 2013/0249052 | A1* | 9/2013 | Appleyard ............ H01L 29/945 257/532 |
| 2014/0235032 | A1 | 8/2014 | Akiyama et al. |

* cited by examiner

DEVICE LAYER TRANSFER WITH A PRESERVED HANDLE WAFER SECTION

BACKGROUND

The invention relates generally to semiconductor devices and integrated circuit fabrication and, in particular, to assemblies including a device layer of a semiconductor-on-insulator (SOI) substrate and a replacement substrate replacing a handle wafer of the SOI substrate, and to methods for transferring the device layer of the SOI substrate from the handle wafer of the SOI substrate to the replacement substrate.

Devices fabricated using semiconductor-on-insulator technologies may exhibit certain performance improvements in comparison with comparable devices built directly in a bulk silicon substrate. Generally, an SOI wafer includes a thin device layer of semiconductor material, a handle wafer, and a thin buried insulator layer, such as a buried oxide or BOX layer, physically separating and electrically isolating the device layer from the handle wafer. Integrated circuits may be fabricated using the semiconductor material of the device layer at the front side surface of the SOI wafer and possibly the semiconductor material of the handle wafer.

Wafer thinning has been driven by the need to make packages thinner to accommodate stacking and high density packaging of chips. An SOI wafer may be thinned by removing the handle wafer from its construction and, once thinned, subjecting the backside surface to additional operations. To lend mechanical support during thinning and any additional operations performed after thinning, the front side surface may be adhesively bonded to a temporary substrate. After the additional operations are performed, a permanent substrate may be attached to the backside surface as a replacement for the handle wafer and the temporary substrate may be removed from the front side surface.

Improved assemblies including a device layer of an SOI substrate and a replacement substrate for a handle wafer of the SOI substrate, and improved methods for transferring a device layer of the SOI substrate from the handle wafer to a replacement substrate are needed.

SUMMARY

In an embodiment of the invention, a method includes forming a device structure in a first section of a handle wafer of a silicon-on-insulator substrate, removing a second section of the handle wafer adjoining the first section of the handle wafer to expose a buried dielectric layer of the silicon-on-insulator substrate, and attaching a permanent substrate to the surface of the buried dielectric layer. When the permanent substrate is attached to the buried dielectric layer, the first section of the handle wafer is received inside a cavity defined in the permanent substrate.

In an embodiment of the invention, an assembly is formed using a silicon-on-insulator substrate. The assembly includes a device layer of the silicon-on-insulator substrate and a buried insulator layer of the silicon-on-insulator substrate. The buried insulator layer has a first surface in contact with the device layer and a second surface opposite the first surface. The assembly includes a section of a handle wafer of the silicon-on-insulator substrate disposed on the second surface of the buried insulator layer, and a device structure in the section of the handle wafer. The assembly further includes a permanent substrate attached to the buried insulator layer. The permanent substrate includes a cavity configured to receive the section of the handle wafer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
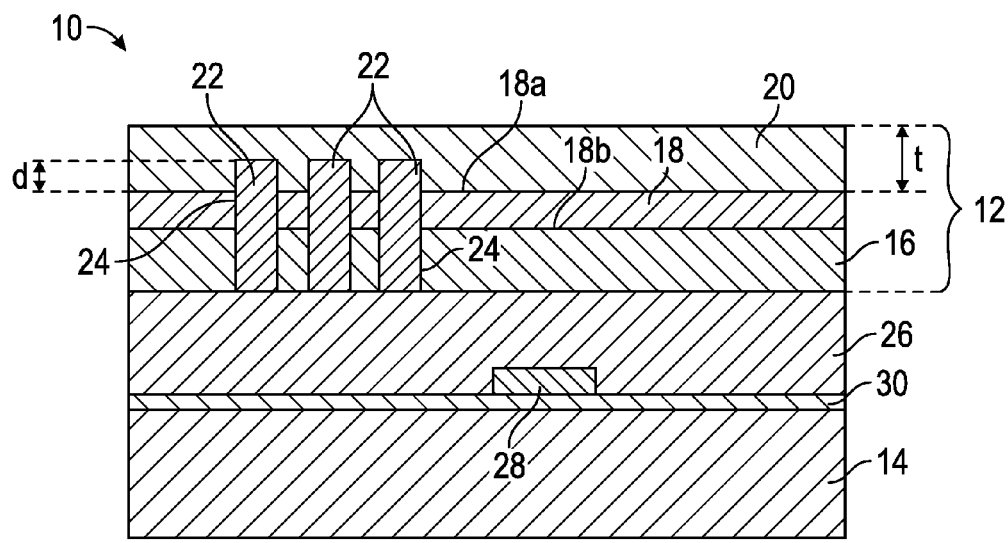
FIG. 1 is a cross-sectional view of a portion of a substrate at an initial fabrication stage of a processing method for forming an assembly in accordance with an embodiment of the invention and in which the assembly is shown inverted.

With reference to FIG. 1 and in accordance with an embodiment of the invention, an assembly 10 includes a semiconductor-on-insulator (SOI) substrate 12 and a temporary substrate 14 that has been removably attached to the front side of the SOI substrate 10 after formation of devices and wires on the SOI substrate 10. The SOI substrate 12 may include a device layer 16, a buried dielectric layer 18 in the form of a buried oxide (BOX) layer, and a handle wafer 20. The device layer 16 is separated from the handle wafer 20 by the intervening buried dielectric layer 18 and is considerably thinner than the handle wafer 20. The buried dielectric layer 18 has a surface 18a in direct contact with the handle wafer 20 and another surface 18b in direct contact with the device layer 16, and these surfaces 18a, 18b are separated by the thickness of the buried dielectric layer 18.

The device layer 16 and the handle wafer 20 may be comprised of a single crystal semiconductor material, such as silicon. The device layer 16 may contain CMOS transistors or bipolar junction transistors, passives, silicided silicon, shallow trench isolation oxide, etc. The buried dielectric layer 18 may be comprised of an electrical insulator and, in particular, may be a buried oxide layer comprised of silicon dioxide (e.g., $SiO_2$). The device layer 16 is electrically isolated from the handle wafer 20 by the buried dielectric layer 18.

Front-end-of-line (FEOL) processing is used to fabricate device structures of one or more integrated circuits using the device layer 16 and to thereby form a chip before the temporary substrate 14 is removably attached. The device structures may be bipolar junction transistors, field effect transistors, passives, and/or coplanar waveguide (CPW) transmission lines as discussed above, and the integrated circuits on chips formed from the assembly 10 may be configured for end use in high-frequency and high-power applications (e.g., power amplifiers for wireless communications systems and mobile devices) and in high-speed logic circuits. The integrated circuits may include various functional blocks, such as switches, power amplifiers, power management units, filters, etc.

In a representative embodiment, the device structures may include one or more deep trench capacitors 22 formed in deep trenches 24 extending through the device layer 16 and the buried dielectric layer 18, and penetrating to a given depth, d, into the handle wafer 20. Multiple deep trenches 24 and deep trench capacitors 22 may be arranged in an array to form multiple device structures. The deep trenches 24 may be formed by applying a hardmask, patterning the hardmask with photolithography and etching, and then using a reactive ion etch (RIE) process to define the deep trench. The etching process may be conducted in a single etching step or multiple etching steps, may rely on one or more etch chemistries, and may be performed under conditions controlled to provide the limited penetration depth of the deep trenches 24 into the handle wafer 20.

Each deep trench capacitor 22 may include an insulator layer formed on the sidewalls of the respective deep trench 24 as a liner and a plug comprised of an electrical conductor, such as doped polysilicon, that occupies the remaining space. The insulator layer operates as a capacitor dielectric in the deep trench capacitor 22, the plug operates as an electrode or plate of the deep trench capacitor 22, and the handle wafer 20 adjacent to the deep trench 24 operates as another electrode or plate of the deep trench capacitor 22 and may be doped with n-type or p-type dopants to reduce the parasitic resistance.

Middle-of-line (MOL) and back-end-of-line (BEOL) processing follows front-end-of-line processing to form a multi-level interconnect structure, generally indicated by reference numeral 26, overlying the device layer 16 of the SOI substrate 12. The interconnect structure 26 may be comprised of wiring in a plurality of wiring levels that supplies conductive paths for signals, clock, power, etc. The wiring of the interconnect structure 26 is coupled with the integrated circuits of the chip and, in particular, may be coupled with the deep trench capacitors 22. Other active and passive circuit elements, such as diodes, resistors, capacitors, varactors, and inductors, may be integrated into the interconnect structure 26.

The wiring levels may be formed by deposition, lithographic patterning, etching, and polishing techniques characteristic of damascene and/or subtractive patterning. Candidate conductors for the wiring include metals such as copper (Cu), aluminum (Al), aluminum copper (AlCu), and tungsten (W) combined with refractory metals such as tantalum (Ta), titanium (Ti), tantalum nitride (TaN), and titanium nitride (TiN), which may be deposited by chemical vapor deposition, physical vapor deposition, evaporation, or by an electrochemical process like electroplating or electroless plating. The wiring of the different wiring levels is embedded in dielectric layers that may be comprised of any suitable organic or inorganic dielectric material, such as silicon dioxide, silicon nitride, hydrogen-enriched silicon oxycarbide (SiCOH), and fluorosilicate glass (FSG), that may be deposited, for example, by chemical vapor deposition.

In particular, a topmost wiring level of the interconnect structure 26 may include a bond pad 28 that is accessible for establishing an external connection with the integrated circuits on the chip. The bond pad 28 may be comprised of copper, aluminum, or an alloy of these metals. The bond pad 28 may function, for example, as a power distribution pad coupled to either positive supply voltage ($V_{DD}$) or ground ($V_{SS}$) to power the active circuitry on the chip, as an input/output (I/O) pad for communicating signals to and from the active circuitry on the chip, or as a dummy pad electrically isolated from the active circuitry of the chip.

The temporary substrate 14 is removably attached to a top surface of the interconnect structure 26 at the front side of the SOI substrate 12 while the handle wafer 20 is intact and before thinning, and after front-end-of-line, middle-of-line, and back-end-of-line processing are completed. For example, the temporary substrate 14 may be adhesively bonded by an adhesive layer 30 to the top surface of interconnect structure 26 in order to provide the releasable or removable attachment. The temporary substrate 14 is sufficiently thick to allow for mechanical handling when the thickness of the handle wafer 20 is reduced in a subsequent fabrication stage in order to thin the SOI substrate 12 at its backside. The temporary substrate 14 may be comprised of quartz, glass, or a different material. The adhesive layer 30 may be comprised of a polymer adhesive, such as a polyimide adhesive or, more specifically, a HD3007 polyimide adhesive. The adhesive strength of the adhesive layer 30 may be selected such that the temporary substrate 14 is readily releasable from its attachment to the top surface of the interconnect structure 26 in a subsequent debonding operation using, for example, laser or mechanical release.

The handle wafer 20 is partially removed from its backside toward the interface with the buried dielectric layer 18 at surface 18a through thinning by grinding, etching, and/or polishing. The thinning process is controlled to retain a residual thickness, t, of the handle wafer 20 so that the back surface 18a of the buried dielectric layer 18 remains completely covered at the conclusion of the thinning. The residual thickness of the handle wafer 20 is selected to be greater than the penetration depth of the deep trenches 24 for the deep trench capacitors 22 into the handle wafer 20. In an embodiment, the residual thickness of the handle wafer 20 may be 5 µm to 20 µm greater than the penetration depth of the deep trenches 24 for the deep trench capacitors 22 into the handle wafer 20. As a result, the integrity of the deep trenches 24 is not compromised by the thinning process, and the deep trench capacitors 22 and deep trenches 24 are intact and undisturbed after the process thinning the handle wafer 20 is completed.

Figure 2:
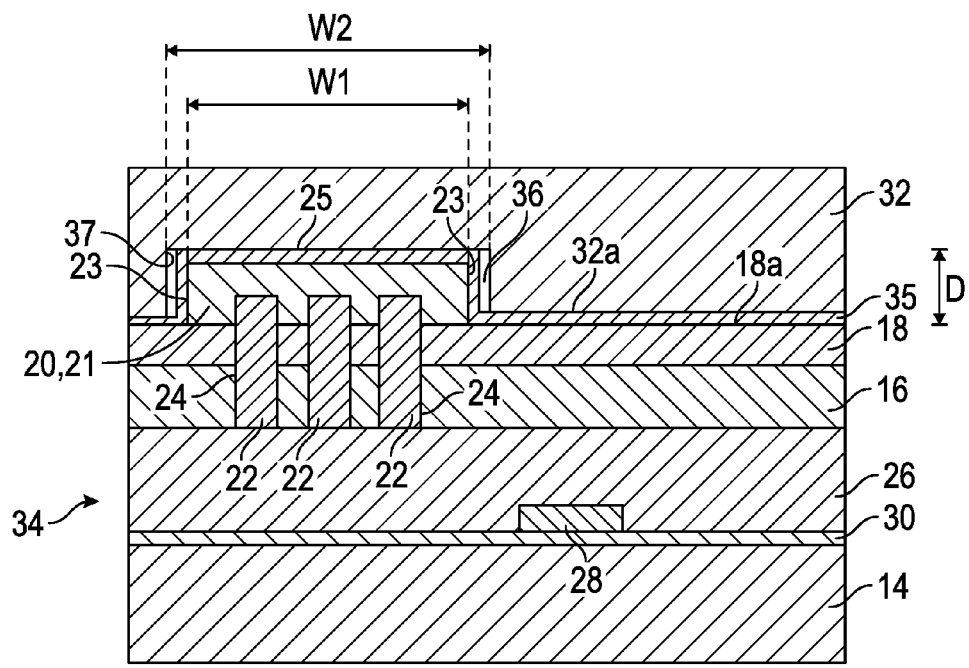
FIG. 2 is a cross-sectional view of the substrate portion of FIG. 1 at a subsequent fabrication stage of the processing method.

With reference to FIG. 2 in which like reference numerals refer to like features in FIG. 1 and at a subsequent fabrication stage of the processing method, the residual thickness of the handle wafer 20 is lithographically patterned and etched to remove the semiconductor material of the handle wafer 20 in locations other than the location that includes the deep trenches 24. The result is a preserved section 21 of the handle wafer 20 that is retained at the location of the deep trenches 24. The preserved section 21 of the handle wafer 20 includes side surfaces 23 extending from a top surface 25 to the surface 18a of the buried dielectric layer 18.

The preserved section 21 of the handle wafer 20 has a non-zero thickness that is equal to the thickness of the handle wafer 20 after thinning, and has a width, W1, and a length in a plane normal to the thickness. The handle wafer 20 has a zero thickness adjacent to the preserved section 21 of the handle wafer 20 that results in the buried dielectric layer 18 being exposed. This zero thickness region of the handle wafer 20 may eliminate coupling to the substrate from devices such as SOI switches, which may improve switch properties such as insertion loss and linearity.

To pattern the residual thickness of the handle wafer 20, a mask layer comprised of a light-sensitive material, such as a photoresist, may be applied by a spin coating process, pre-baked, exposed to light projected through a photomask, baked after exposure, and developed with a chemical developer to define an etch mask covering the preserved section 21 of the handle wafer 20. An etching process is used, with the mask layer present, to form the preserved section 21 of the handle wafer 20 by removing the unmasked sections of the handle wafer 20 and stopping on the material of the buried dielectric layer 18. The etching process may be conducted in a single etching step or multiple etching steps, may rely on one or more etch chemistries, may use dry plasma or wet etch processes, and may be performed under conditions controlled to provide the limited penetration depth into the SOI substrate 12. Examples of etch processes for a silicon handle wafer 20 are sulfur hexafluoride-based plasma etching or potassium hydroxide-based wet silicon etching.

The unmasked sections of the handle wafer 20 may be removed selective to the buried dielectric layer 18 so that the buried dielectric layer 18 remains intact after the handle wafer 20 is removed. As used herein, the term "selective" in reference to a material removal process (e.g., etching) denotes that, with an appropriate etchant choice, the material removal rate for the targeted material is higher than the removal rate for at least another material exposed to the material removal process.

The mask layer may be removed after preserved section 21 of the handle wafer 20 is defined by the etching process. If comprised of a photoresist, the mask layer may be removed by ashing or solvent stripping, followed by a conventional cleaning process.

A permanent substrate 32 is attached to the buried dielectric layer 18 to create an intermediate assembly 34 that still includes the temporary substrate 14. In particular, the back surface 18a of the buried dielectric layer 18 is placed in contact with a top surface 32a of the permanent substrate 32, and these surfaces 18a, 32a are subsequently bonded together by, for example, a thermal process (e.g., oxide bonding) or with an adhesive layer, such as HD3007 polyimide. In this intermediate assembly, the device layer 16, the buried dielectric layer 18, and the interconnect structure 26 are positioned between the temporary substrate 14 and the permanent substrate 32. When the buried dielectric layer 18 of the SOI substrate 12 and the permanent substrate 32 are bonded together, the bonded surfaces 18a, 32a are co-planar or substantially coplanar.

In various embodiments, the permanent substrate 32 may be an engineered high-resistance wafer comprised of high-resistance silicon, sapphire, quartz, silica glass, alumina, etc. The handle wafer 20, which may be an inexpensive substrate (e.g., a common silicon wafer), is present during processing to fabricate the integrated circuits of the chip and is then replaced by the permanent substrate 32 to provide a final assembly that may be expected to exhibit improved performance metrics.

The permanent substrate 32 includes a cavity 36 that is recessed relative to the surface 32a that is attached to the surface 18a of the buried dielectric layer 18. The cavity 36 is strategically positioned to be aligned with the preserved section 21 of the handle wafer 20 containing the deep trench capacitors 22 at assembly time. The cavity 36 has a surface 37 that is geometrically shaped to reflect the surfaces 23, 25 of the preserved section 21 of the handle wafer 20. The cavity 36 has a depth, D, that is greater than the thickness of the thinned handle wafer 20 and, in particular, the thickness of the preserved section 21 of the handle wafer 20. The cavity 36 has a width, W2 (and length) that is greater than the width (and length) of the preserved section 21 of the handle wafer 20.

In the representative embodiment, the permanent substrate 32 may be attached to the buried dielectric layer 18 with an adhesive layer 35. The dimensions of the cavity 36 may provide a clearance gap between the preserved section 21 of the handle wafer 20 to allow for the thickness of the adhesive layer 35 and placement tolerance. In an embodiment, the depth of the cavity 36 may be 4 µm to 8 µm greater than the residual thickness of the preserved section 21 of the handle wafer 20, and the width of the cavity 36 may be less than or equal to 30 µm greater than the width of the preserved section 21 of the handle wafer 20 to allow for placement tolerance during assembly and for the adhesive layer 35.

In an alternative embodiment, the permanent substrate 32 may be attached to the buried dielectric layer 18 without the use of adhesive. In this instance, the dimensions of the cavity 36 may be smaller so that the clearance with the preserved section 21 of the handle wafer is reduced or eliminated. In a specific embodiment, the size of the cavity 36 may be equal to, or slightly larger than, the size of the preserved section 21 of the handle wafer 20.

A portion of the permanent substrate 32 is selectively removed to accommodate the preserved section 21 that protrudes from the surface 18a of the buried dielectric layer 18 upon which the device structure is formed. To form the cavity 36, a mask layer may be applied to the surface of the permanent substrate 32 to be subsequently coupled with the buried dielectric layer 18 and patterned with photolithography. To that end, the mask layer may comprise a light-sensitive material, such as a photoresist, that is applied by a spin coating process, pre-baked, exposed to light projected through a photomask, baked after exposure, and developed with a chemical developer to define an etch mask with an opening at the intended location for the cavity 36. The dimensions of the opening are selected to provide the width and length needed for the cavity 36. An etching process is used, with the mask layer present, to form the cavity 36. The etching process may be conducted in a single etching step or multiple etching steps, may rely on one or more etch chemistries, and may be performed under conditions controlled to provide a limited penetration depth into the permanent substrate 32. The mask layer may be removed after the cavity 36 is formed by the etching process. If comprised of a photoresist, the mask layer may be removed by ashing or solvent stripping, followed by a conventional cleaning process.

Figure 3:
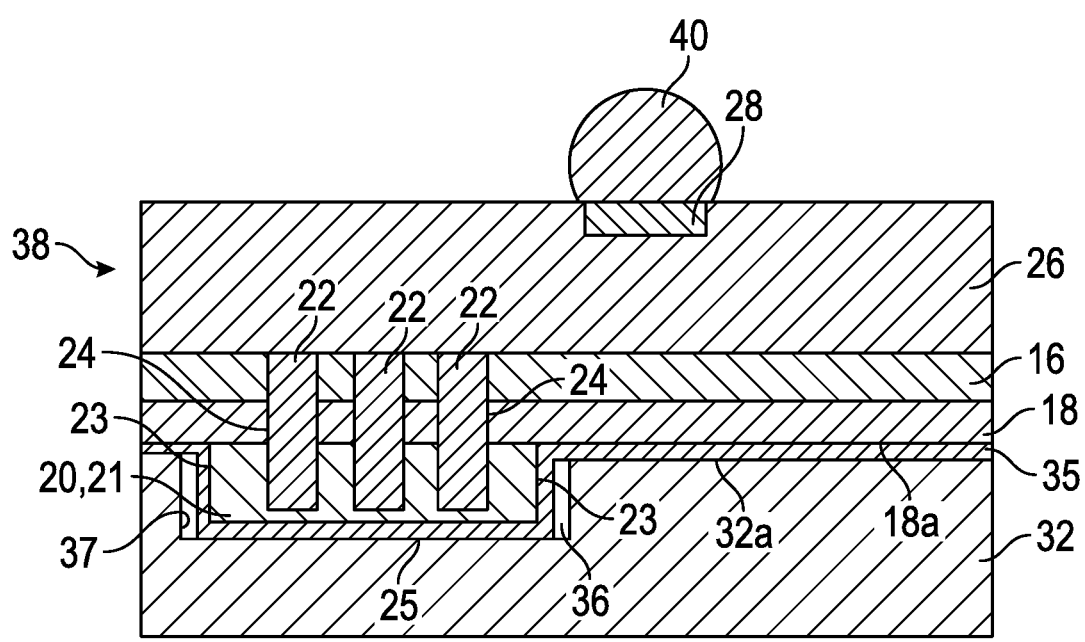
FIG. 3 is a cross-sectional view of the substrate portion of FIG. 2 at a subsequent fabrication stage of the processing method and in which the assembly is shown non-inverted.

With reference to FIG. 3 in which like reference numerals refer to like features in FIG. 2 and at a subsequent fabrication stage of the processing method, the temporary substrate 14 is subsequently removed without disturbing the bond between the permanent substrate 32 and the buried dielectric layer 18 to provide a final assembly 38. For example, the intermediate assembly 34 may be placed on a heated chuck to reduce the strength of the adhesive bond provided by the adhesive layer 30 so that the temporary substrate 14 can be easily removed with applied force. Alternatively, the adhesive layer 30 may be laser released followed by temporary substrate 14 removal and then an optional wet or plasma clean to remove residual adhesive.

The temporary substrate 14 functions to facilitate the transfer of the integrated circuits in and on the device layer 16 to the permanent substrate 32. The permanent substrate 32 in the final assembly replaces the handle wafer 20 of the SOI substrate 12 in the initial assembly 10. A connect structure 40, such as solder bump, copper pillar, wirebond, or wafer level chip scale package may be formed on the bond pad 28, followed by a backside grind, dicing, and packaging of the chip.

In an alternative embodiment, the type of device structure utilizing the preserved section 21 of the handle wafer 20 may differ from the representative deep trench capacitors 22. For example, the type of device structure may comprise one or more resistors, one or more capacitors, one or more transistors, one or more inductors, etc. In a specific alternative embodiment, the device structure may be a bipolar junction transistor with a collector and sub-collector formed in the handle wafer 20. In addition, the construction may be replicated to include multiple preserved sections like preserved section 21 and multiple cavities like cavity 36 that are registered with the preserved sections.

Deep trench capacitors 22 are commonly used in SOI technologies. Except for section 21 (and other similar preserved sections), the removal of the handle wafer 20 by backside thinning exposes the surface 18a of the buried dielectric layer 18. By preserving the section 21 following backside thinning of the handle wafer 20 that exposes the remainder of the buried dielectric layer 18, embodiments of the invention promote the integration of SOI CMOS devices with deep trench capacitors 22 on a permanent substrate 32 characterized by engineered properties. This allows for the use of deep trench capacitors and low RF loss substrates on the same wafer or chip.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refers to a direction perpendicular to the horizontal, as just defined. The term "lateral" refers to a dimension within the horizontal plane.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   providing a silicon-on-insulator substrate that includes a device layer, a handle wafer, and a buried insulator layer between the device layer and the handle wafer;
   forming one or more deep trench capacitors extending through the device layer and the buried dielectric layer into a first section of the handle wafer;
   removing a second section of the handle wafer adjoining the first section of the handle wafer to expose a surface of a buried dielectric layer of the silicon-on-insulator substrate;
   attaching a permanent substrate to the surface of the buried dielectric layer; and
   receiving the first section of the handle wafer inside a cavity defined in the permanent substrate when the permanent substrate is attached to the buried dielectric layer.

2. The method of claim 1 wherein the cavity is dimensioned and positioned to receive the first section of the handle wafer, the permanent substrate has a surface attached to the surface of the buried dielectric layer, and the surface of the buried dielectric layer is coplanar with the surface of the permanent substrate when the permanent substrate is attached to the surface of the buried dielectric layer.

3. The method of claim 1 wherein the device structure is formed in the first section of the handle wafer before the second section of the handle wafer is removed.

4. The method of claim 1 wherein the device structure is formed in the first section of the handle wafer before the permanent substrate is attached.

5. The method of claim 1 wherein attaching the permanent substrate to the buried dielectric layer comprises:
   adhesively bonding the permanent substrate to the buried dielectric layer with an adhesive layer,
   wherein the cavity is dimensioned and positioned to receive the first section of the handle wafer with a portion of the adhesive layer between the first section and the permanent substrate.

6. The method of claim 1 wherein the device structure is formed at least partially in a device layer of the silicon-on-insulator substrate.

7. The method of claim 1 wherein a portion of the first section of the handle wafer is disposed between the one or more deep trench capacitors and the permanent substrate.

8. The method of claim 1 further comprising:
   before the second section of the handle wafer is removed, attaching a temporary substrate to the silicon-on-insulator substrate; and
   after the second section of the handle wafer is removed, removing the temporary substrate from the silicon-on-insulator substrate,
   wherein the temporary substrate, when attached to the silicon-on-insulator substrate, is separated by the buried dielectric layer from the permanent substrate.

9. The method of claim 1 further comprising:
   applying an etch mask to the permanent substrate with an opening at a location for the cavity; and
   etching the cavity in the permanent substrate.

10. The method of claim 1 further comprising:
    thinning the handle wafer;
    after the handle wafer is thinned, applying an etch mask covering the first section of the handle wafer; and
    etching the handle wafer to remove the second section of the handle wafer.

11. The method of claim 1 wherein the permanent substrate has a surface attached to the surface of the buried dielectric layer, and the surface of the buried dielectric layer is coplanar with the surface of the permanent substrate when the permanent substrate is attached to the surface of the buried dielectric layer.

12. The method of claim 1 wherein the permanent substrate is comprised of high resistance silicon, sapphire, quartz, or alumina.

* * * * *